United States Patent
Chin et al.

(10) Patent No.: US 10,651,298 B2
(45) Date of Patent: May 12, 2020

(54) HETEROJUNCTION BIPOLAR TRANSISTOR STRUCTURE WITH A BANDGAP GRADED HOLE BARRIER LAYER

(71) Applicant: VISUAL PHOTONICS EPITAXY CO., LTD., Taoyuan (TW)

(72) Inventors: Yu-Chung Chin, Taoyuan (TW); Chao-Hsing Huang, Taoyuan (TW); Min-Nan Tseng, New Taipei (TW); Kai-Yu Chen, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 0 days.

(21) Appl. No.: 16/161,185

(22) Filed: Oct. 16, 2018

(65) Prior Publication Data
US 2019/0115458 A1   Apr. 18, 2019

(30) Foreign Application Priority Data
Oct. 17, 2017   (TW) .............................. 106135564 A (51) Int. Cl.
| | | |
|---|---|---|
| *H01L 29/73* | (2006.01) | |
| *H01L 29/737* | (2006.01) | |
| *H01L 29/10* | (2006.01) | |
| *H01L 29/205* | (2006.01) | |
| *H01L 29/08* | (2006.01) | |
| *H01L 29/36* | (2006.01) | |
| *H01L 29/778* | (2006.01) | |

(52) U.S. Cl.
CPC ...... *H01L 29/7371* (2013.01); *H01L 29/0817* (2013.01); *H01L 29/0821* (2013.01); *H01L 29/1004* (2013.01); *H01L 29/205* (2013.01); *H01L 29/36* (2013.01); *H01L 29/7785* (2013.01)

(58) Field of Classification Search
CPC ... H01L 29/36; H01L 29/778; H01L 29/0821; H01L 29/205; H01L 29/1004; H01L 29/0817
See application file for complete search history.

(56) References Cited

U.S. PATENT DOCUMENTS

| | | | | |
|---|---|---|---|---|
| 5,631,477 | A * | 5/1997 | Streit | ................. H01L 29/0821 257/197 |
| 6,355,947 | B1 * | 3/2002 | Niwa | ................. H01L 29/0817 257/197 |
| 2005/0139863 | A1 * | 6/2005 | Welser | ............... H01L 29/1004 257/197 |
| 2007/0023783 | A1 * | 2/2007 | Hase | ................. H01L 29/0817 257/197 |

\* cited by examiner

*Primary Examiner* — Kyoung Lee
*Assistant Examiner* — Christina A Sylvia
(74) *Attorney, Agent, or Firm* — Lin & Associates Intellectual Property, Inc.

(57) ABSTRACT

The disclosure provides an HBT structure with bandgap graded hole barrier layer, comprising: a sub-collector layer, a collector layer, a hole barrier layer, a base layer, an emitter layer, an emitter cap layer, and an ohmic contact layer, all stacked sequentially on a substrate; with the hole barrier layer formed of at least one of AlGaAs, AlGaAsN, AlGaAsP, AlGaAsSb, and InAlGaAs, Aluminum composition being less than 22%, and In, N, P, and Sb compositions being respectively less than or equal to 10%; wherein bandgaps of the hole barrier layer at least comprise a gradually increasing bandgap from the base layer towards the collector layer and the largest bandgap of the hole barrier layer is greater than bandgaps of the base layer and the collector layer.

14 Claims, 7 Drawing Sheets

HETEROJUNCTION BIPOLAR TRANSISTOR STRUCTURE WITH A BANDGAP GRADED HOLE BARRIER LAYER

BACKGROUND OF THE INVENTION

1. Field of the Invention

The technical field relates to a heterojunction bipolar transistor (HBT) structure with a bandgap graded hole barrier layer, and in particular to adding a hole barrier layer to the base and collector junction of an HBT structure, wherein the bandgaps of hole barrier layer at least comprise a gradually increasing bandgap from the base layer towards the collector layer.

2. The Prior Arts

Generally, a heterojunction bipolar transistor (HBT) is a specific transistor having an emitter and a base formed by different semiconductor materials. Accordingly, a heterojunction is formed between the emitter and the base. One advantage of an HBT (such as an NPN HBT) is that the emitter injection efficiency is greatly increased because it is difficult for the hole current to flow through the valence band barrier ($\Delta E_v$) between the base and the emitter. The current gain is thus further enhanced under the higher base dopant concentration. The efficiency of power amplifiers is an important factor when HBTs are used in power amplifiers of hand-held devices. It should be noted that the key factors of an HBT are the knee voltage and the turn-on voltage. Therefore, one of the important issues is how to effectively decrease the knee voltage and the turn-on voltage of an HBT. In addition, increasing the operating voltage or current of the power amplifier through the circuit design can improve the power added efficiency (PAE). However, when the HBT is operated at a high power mode, the knee voltage will also be increased which will offset the PAE. Hence, how to effectively reduce the knee voltage of the HBT under high voltage or high current operation is a very important topic.

Taiwan Patent No. I562358 discloses a directed epitaxial heterojunction bipolar transistor (HBT) structure formed directly or indirectly on a GaAs substrate that is formed by a (100) face towards a (111) B face (i.e., (1-11) or (11-1)). The directed epitaxial HBT of the present invention includes a sub-collector layer, a collector layer, a tunnel collector layer, a base layer, an emitter layer, an emitter cap layer and an ohmic contact layer, which are sequentially stacked on the GaAs substrate.

The above patent is a III-V semiconductor HBT formed directly or indirectly on a (100) toward (111) B-orientation GaAs substrate. Specifically, the tunnel collector layer is formed by InGaP or InGaAsP, and the emitter layer is formed by N-type group III-V semiconductors having a bandgap larger than that of the base layer. Since an epitaxial process is performed on the substrate from a (100) face towards a (111) B face, indium and gallium contained in InGaP or InGaAsP are affected by the ordering effect such that InGaP or InGaAsP used in the emitter layer and/or the tunnel collector layer has a higher electron affinity or a smaller bandgap. Accordingly, the conduction band discontinuity between a base-emitter junction and/or a base-tunnel collector junction is decreased so as to lower the turn-on voltage and the offset voltage ($V_{OS}$) of the HBT, thereby improving the collector current blocking effect, decreasing the knee voltage ($V_{KNEE}$), greatly increasing the PAE for the HBT power amplifier (PA) and enhancing the overall electrical characteristics of PA.

However, due to an excessively large valence band discontinuity ($\Delta Ev$) at the junction of the InGaP or InGaAsP tunneling collector layer and the base layer, when HBT operates at a high current density, there are too many holes blocking at base-tunnel collector junction and it causes the junction electric field to change and adversely affect the knee voltage characteristics, which results in the limitation of the PAE at a high current density. Also, at the junction of InGaP or InGaAsP tunneling collector layer and collector layer, due to excessively large valence band discontinuities, an excessively deep quantum well is easily formed, which causes the holes to accumulate in the quantum well, causing unpredictable electric field changes. In addition, the accumulated hole charge will affect the charging and discharging time of HBT, which will affect the PA operation frequency response. Besides, the base layer and the collector layer are usually mainly made of an arsenic-containing only group III-V material, and the tunneling collector layer made of InGaP or InGaAsP with high phosphorus content. As the gas switches from arsenic to phosphorus or from phosphorus to arsenic in epitaxial growth, the intermixing is easy to occur and form an unexpected arsenic and phosphorus compound layer. This arsenic and phosphorus compound layer will make the etching process of the HBT difficult, resulting in lower process yield. In addition, because the InGaP or InGaAsP has a high phosphorus content, when growing bandgap graded epitaxy at the junction with the base or the collector made of an arsenic-containing mainly group III-V material, it is easy to form arsenic-phosphorus intermixing to cause difficulty in controlling the material composition of bandgap graded structure and results in difficulty to achieve the originally designed bandgap graded junctions profile, or even results in difficulty to reproduce the bandgap graded profile. In addition, even the epitaxial growth of InGaP or InGaAsP tunneling collector layer on the (100) toward (111)B-orientation GaAs substrate can reduce the conduction band discontinuities between the base layer and the tunneling collector layer or between the tunneling collector layer and the collector layer, the electron barrier is still difficult to be completely eliminated, which causes the collector current blocking effect when the HBT device is operated at a high current density, and limits the PAE improvement.

Therefore, it is desirable to have an HBT structure with a bandgap graded hole barrier layer that is easy to implement the bandgap graded epitaxial growth technology. In addition to effectively eliminating the electron barrier of the conduction band at the junction of the hole barrier layer and the base layer or the collector layer, it maintains the sufficient hole barrier height to improve the collector current blocking effect in high current density operation, reduce the knee voltage, and increase the PAE. Reducing the depth or eliminating the hole quantum well between the hole barrier layer and the collector layer can reduce or avoid the accumulation of the hole charge, improving the overall HBT electrical characteristics, especially operated at high power mode. The PA saturation power is not suppressed at high power operation.

SUMMARY OF THE INVENTION

The primary object of the present invention is to provide a heterojunction bipolar transistor (HBT) structure with a bandgap graded hole barrier layer, comprising: a sub-collector layer, formed of an N-type group III-V semiconductor and stacked on a substrate; a collector layer, stacked on the sub-collector layer and formed of an N-type group III-V semiconductor; a hole barrier layer, stacked on the collector layer and formed of at least one of AlGaAs, AlGaAsN, AlGaAsP, AlGaAsSb, and InAlGaAs, wherein Aluminum composition is less than 22%, and In, N, P, and Sb compositions are being respectively less than or equal to 10%; a base layer, stacked on the hole barrier layer and formed of a P-type group III-V semiconductor; an emitter layer, stacked on the base layer and formed of an N-type group III-V semiconductor having bandgap larger than that of the base layer; an emitter cap layer, stacked on the emitter layer and formed of an N-type group III-V semiconductor; and an ohmic contact layer, stacked on the emitter cap layer and formed of an N-type group III-V semiconductor; wherein bandgaps of the hole barrier layer at least comprise an increasing bandgap graded from the base layer towards the collector layer, with the largest bandgap of the hole barrier layer greater than bandgaps of the base layer and the collector layer respectively.

The foregoing will become better understood from a careful reading of a detailed description provided herein below with appropriate reference to the accompanying drawings.

BRIEF DESCRIPTION OF THE DRAWINGS

The embodiments can be understood in more detail by reading the subsequent detailed description in conjunction with the examples and references made to the accompanying drawings, wherein.

DETAILED DESCRIPTION OF THE PREFERRED EMBODIMENTS

The present invention may be embodied in various forms, and the details of the preferred embodiments of the present invention will be described in the subsequent contents with reference to the accompanying drawings. The drawings (not to scale) show and depict only the preferred embodiments of the present invention, and will not be considered as limitations to the scope of the present invention. Modifications of the present invention should be considered within the spirit of the present invention.

Figure 1:
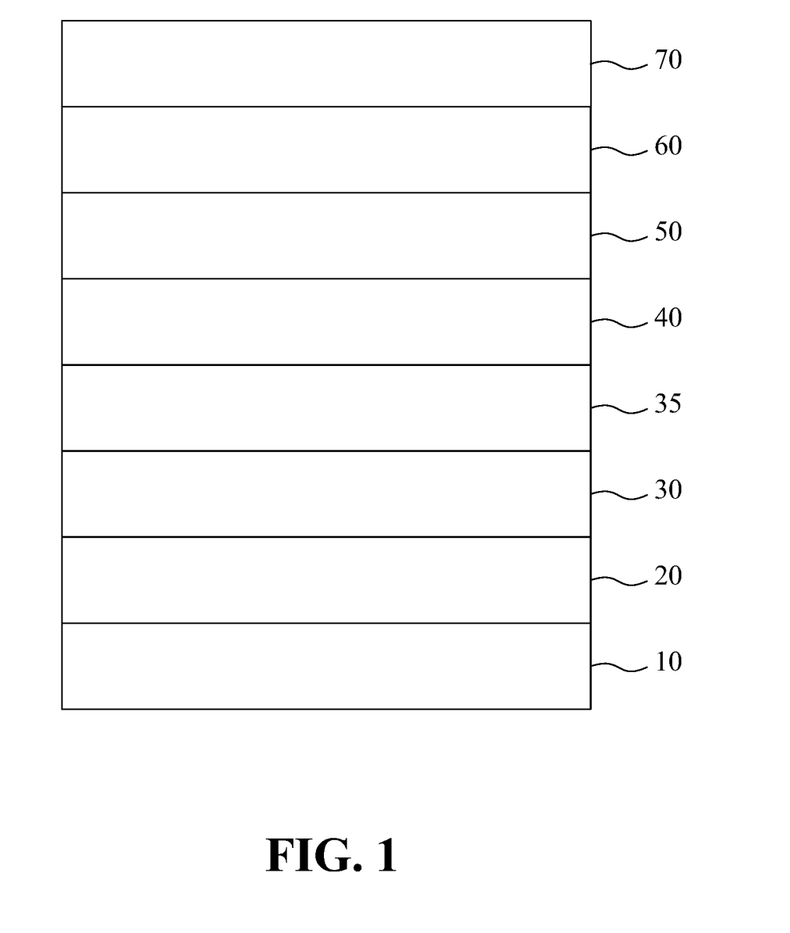
FIG. 1 shows a schematic view of a heterojunction bipolar transistor structure with a bandgap graded hole barrier layer in accordance with the first exemplary embodiment of the present invention.

FIG. 1 shows a schematic view of a heterojunction bipolar transistor (HBT) structure with a bandgap graded hole barrier layer in accordance with the first exemplary embodiment of the present invention. As shown in FIG. 1, the HBT structure with a bandgap graded hole barrier layer of the present invention comprises: a sub-collector layer 20, a collector layer 30, a hole barrier layer 35, a base layer 40, an emitter layer 50, an emitter cap layer 60, and an ohmic contact layer 70, all stacked sequentially on a substrate 10 from bottom up; wherein the sub-collector layer 20 is formed of an N-type group III-V semiconductor and stacked on the substrate 10; the collector layer 30 is stacked on the sub-collector layer 20 and formed of an N-type group III-V semiconductor; it should be noted that the hole barrier layer 35 is stacked on the collector layer 30 and formed of at least one of AlGaAs, AlGaAsN, AlGaAsP, AlGaAsSb, and InAlGaAs, wherein Aluminum composition is less than 22%, preferably between 6%-18% and optimally between 8%-16%; the thickness of the hole barrier layer 35 is between 1 nm-300 nm, preferably between 5 nm-100 nm, and optimally between 10 nm-60 nm; the hole barrier layer 35 can be P-type (with a dope concentration less than $1\times10^{19}/cm^3$, preferably less than $1\times10^{18}/cm^3$, and optimally less than $1\times10^{17}/cm^3$), undoped, or N-type; preferably, the hole barrier layer 35 is undoped or N-type, and optimally, the hole barrier layer 35 is N-type, with a doping concentration greater than $1\times10^{15}/cm^3$, preferably between $1\times10^{15}/cm^3$ and $1\times10^{19}/cm^3$, and optimally between $1\times10^{16}/cm^3$ and $5\times10^{18}/cm^3$; the base layer 40 is stacked on the hole barrier layer 35 and formed of a P-type group III-V semiconductor; the emitter layer 50 is stacked on the base layer 40 and formed of an N-type group III-V semiconductor having bandgap larger than that of the base layer 40; the emitter cap layer 60 is stacked on the emitter layer 50 and formed of an N-type group III-V semiconductor; and the ohmic contact layer 70 is stacked on the emitter cap layer 60 and formed of an N-type group III-V semiconductor; wherein it should be noted that bandgaps of the hole barrier layer 35 at least comprise a gradually increasing bandgap graded from the base layer 40 towards the collector layer 30 and the largest bandgap of the hole barrier layer is greater than bandgaps at the base layer and the collector layer respectively.

Specifically, the collector layer 30 may be formed of at least one of N-type GaAs and AlGaAs, and the base layer 40 may be formed of at least one of P-type GaAs, GaAsSb, InGaAs, and InGaAsN. The emitter layer may be formed of at least one of N-type AlGaAs, InGaP, and InGaAsP, and the thickness of the hole barrier layer 35 is 1 nm-300 nm. The emitter cap layer 60 may be formed of at least one of N-type GaAs, AlGaAs, InGaP, and InGaAsP. The ohmic contact layer 70 may be formed of at least one of N-type GaAs and InGaAs.

Because the hole barrier layer 35 comprises the graded bandgap, the present invention can eliminate or reduce the conduction band electron barrier of the junction of the hole barrier layer 35 and the base layer 40 or the collector layer 30. Therefore the substrate 10 of the present invention is not limited to a certain tilt orientation (e.g., tilted from the (100) face toward the (111)B-face) and to the use of the InGaP or InGaAsP epitaxial layer material. By selecting the compositions of the hole barrier layer 35 and composition graded, this invention can maintain a sufficient hole barrier height at the junction of the hole barrier layer 35 and the base layer 40, and reduce the depth or eliminate the valence band quantum well at the junction between the hole barrier layer 35 and the collector layer 30, thereby further improving the PAE and frequency response of PA in high current density operation without suppression on the output saturation power.

Moreover, the present invention may further comprise at least a spacer layer (not shown), provided between the hole barrier layer and the base layer and/or between the hole barrier layer and the collector layer, and formed of a group III-V semiconductor. In other words, the spacer layer may be formed of at least one of GaAs, GaAsSb, InGaAs, InGaAsN, AlGaAs, AlGaAsSb, AlGaAsP, InAlGaAs, and AlGaAsN. It should be noted that the spacer layer may be P-type (with doping concentration less than $1\times10^{19}/cm^3$; preferably, less than $1\times10^{18}/cm^3$; and optimally, less than $1\times10^{17}/cm^3$), undoped or N-type; preferably, the spacer layer is undoped or N-type; and optimally, the spacer layer is N-type, with a doping concentration greater than $1\times10^{15}/cm^3$; preferably, between $1\times10^{15}/cm^3$ and $1\times10^{19}/cm^3$; and optimally, between $1\times10^{16}/cm^3$ and $5\times10^{18}/cm^3$. It should be noted that the thickness of the spacer layer is between 0.1 nm-100 nm; preferably, between 3 nm-80 nm; and optimally, between 5 nm-50 nm.

Figure 2:
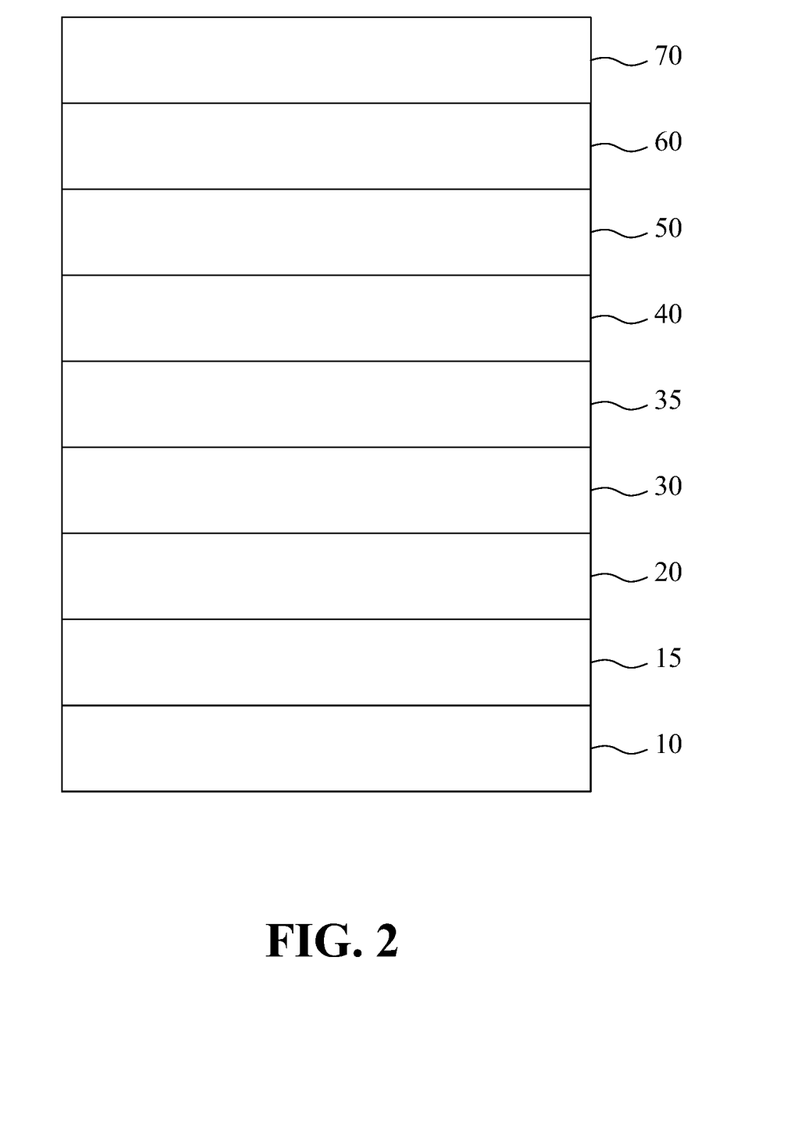
FIG. 2 shows a schematic view of a heterojunction bipolar transistor structure with a bandgap graded hole barrier layer in accordance with the second exemplary embodiment of the present invention.

FIG. 2 shows a schematic view of a heterojunction bipolar transistor structure with a bandgap graded hole barrier layer in accordance with the second exemplary embodiment of the present invention. As shown in FIG. 2, the HBT structure with a bandgap graded hole barrier layer of the second embodiment comprises: an intermediate composite layer 15, a sub-collector layer 20, a collector layer 30, a hole barrier layer 35, a base layer 40, an emitter layer 50, an emitter cap layer 60, and an ohmic contact layer 70, all stacked sequentially on a substrate 10 from bottom up. It should be noted that the second embodiment shown in FIG. 2 differs from the first embodiment shown in FIG. 1 in that the intermediate composite layer 15 is provided between the substrate 10 and the sub-collector layer 20. The remaining layers in the second embodiment are the same as in the first embodiment, and the details will not be repeated here.

Specifically, the intermediate composite layer 15 may comprises at least a buffer layer (not shown), and the buffer layer is formed of a group III-V semiconductor. Alternatively, the intermediate composite layer 15 may comprise a field effect transistor (FET).

Moreover, the intermediate composite layer 15 may also comprise a pseudomorphic high electron mobility transistor (pHEMT), and the pHEMT comprises at least a buffer layer, a first donor layer, a first spacer layer, a channel layer, a second spacer layer, a second donor layer, a Schottky layer, an etch stop layer, and a cap layer (not shown) for ohmic contact, all stacked sequentially on a substrate 10 from bottom up. In particular, the buffer layer is formed of a group III-V semiconductor. The first donor layer and the second donor layer are formed of at least one of N-type GaAs, N-type AlGaAs, N-type InAlGaP, N-type InGaP and N-type InGaAsP; the first spacer layer and the second spacer layer are formed of at least one of GaAs, AlGaAs, InAlGaP, InGaP, and InGaAsP; the channel layer is formed of at least one of GaAs, InGaAs, AlGaAs, InAlGaP, InGaP, and InGaAsP; the Schottky layer is formed of at least one of GaAs, AlGaAs, InAlGaP, InGaP, and InGaAsP; the etch stop layer is formed of at least one of GaAs, AlGaAs, InAlGaP, InGaAsP, InGaP, and AlAs; and the cap layer is formed of an N-type group III-V semiconductor.

Figure 3A:
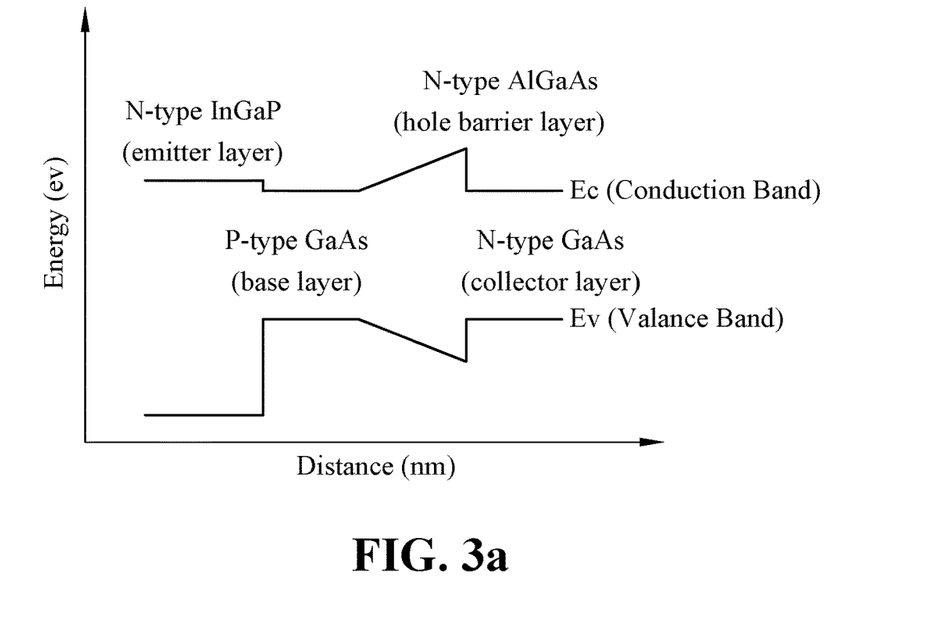
FIG. 3a and FIG. 3b show schematic views of the energy band diagram of the bandgap graded hole barrier layer of heterojunction bipolar transistor structure in accordance with an exemplary embodiment of the present invention.
Figure 3B:
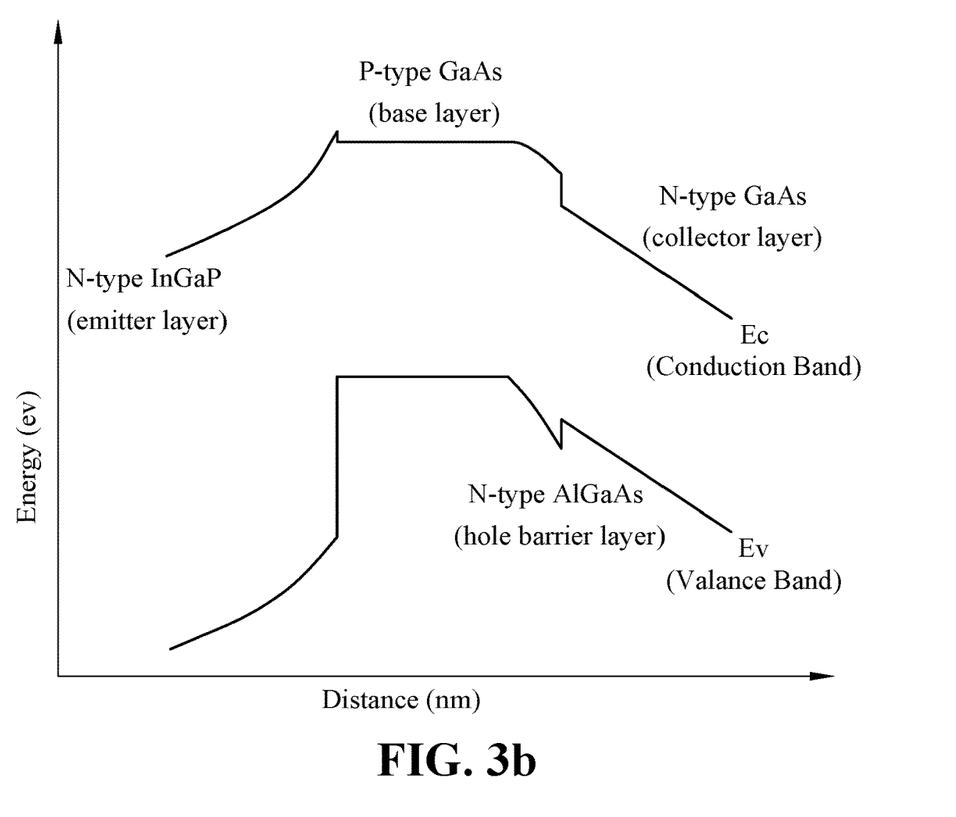
Figure 4A:
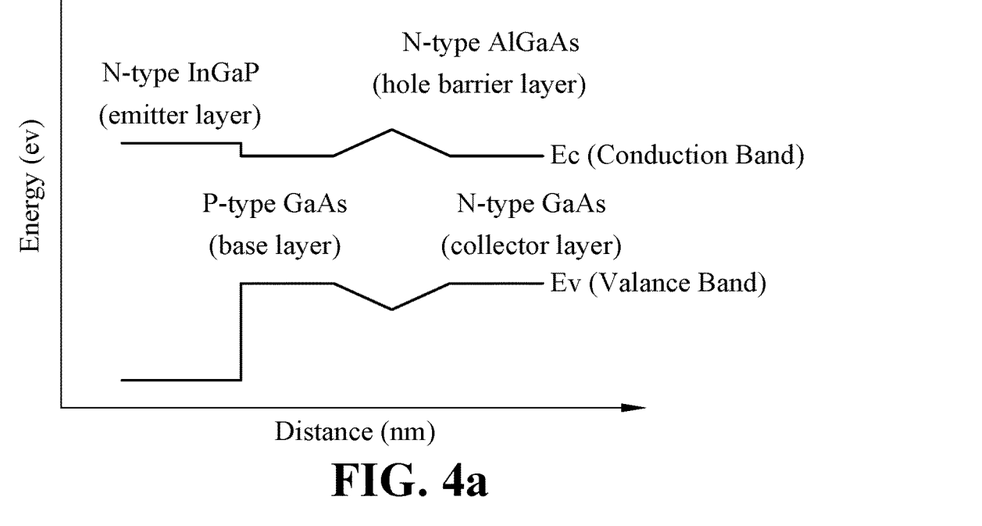
FIG. 4a and FIG. 4b show schematic views of the energy band diagram of the bandgap graded hole barrier layer of heterojunction bipolar transistor structure in accordance with another exemplary embodiment of the present invention.
Figure 4B:
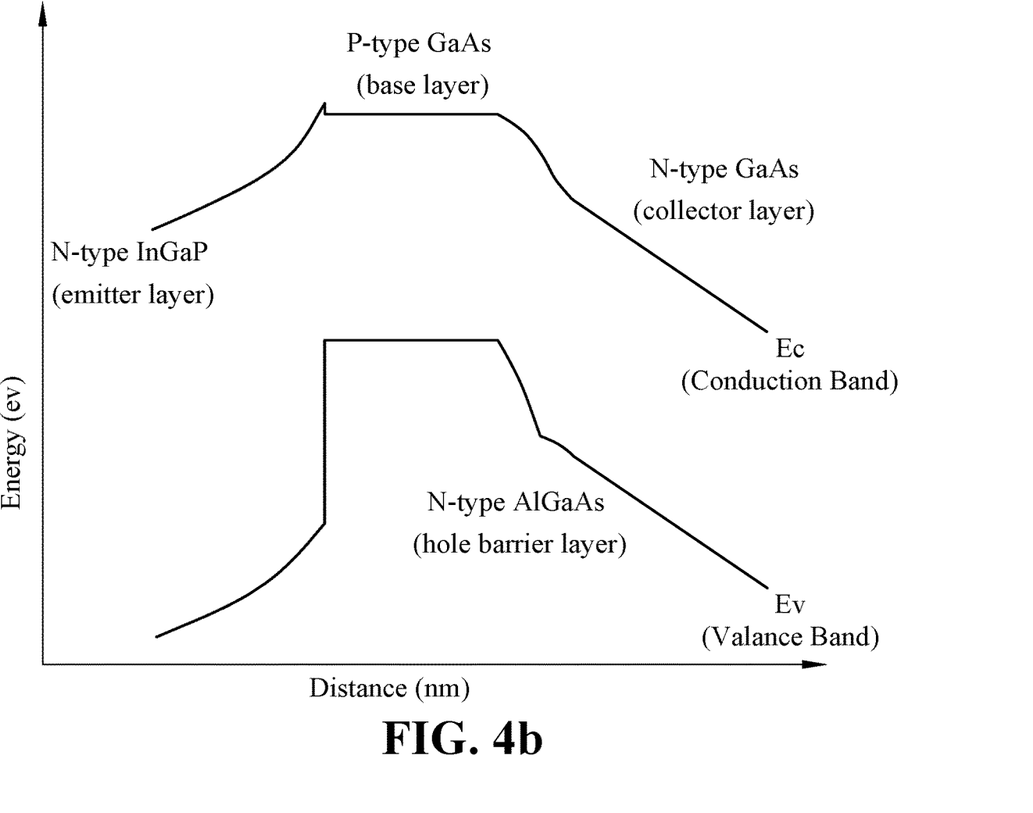
Figure 5A:
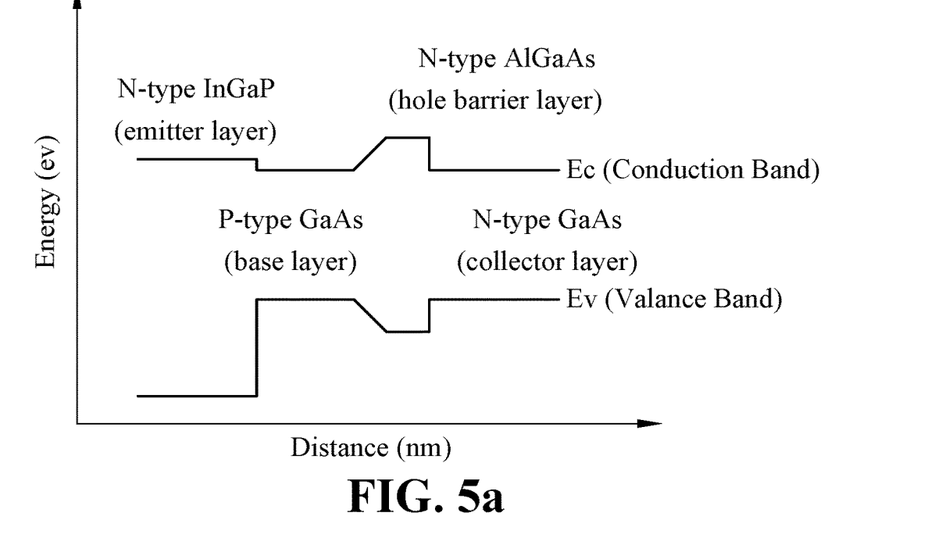
FIG. 5a and FIG. 5b show schematic views of the energy band diagram of the bandgap graded hole barrier layer of heterojunction bipolar transistor structure in accordance with yet another exemplary embodiment of the present invention.
Figure 5B:
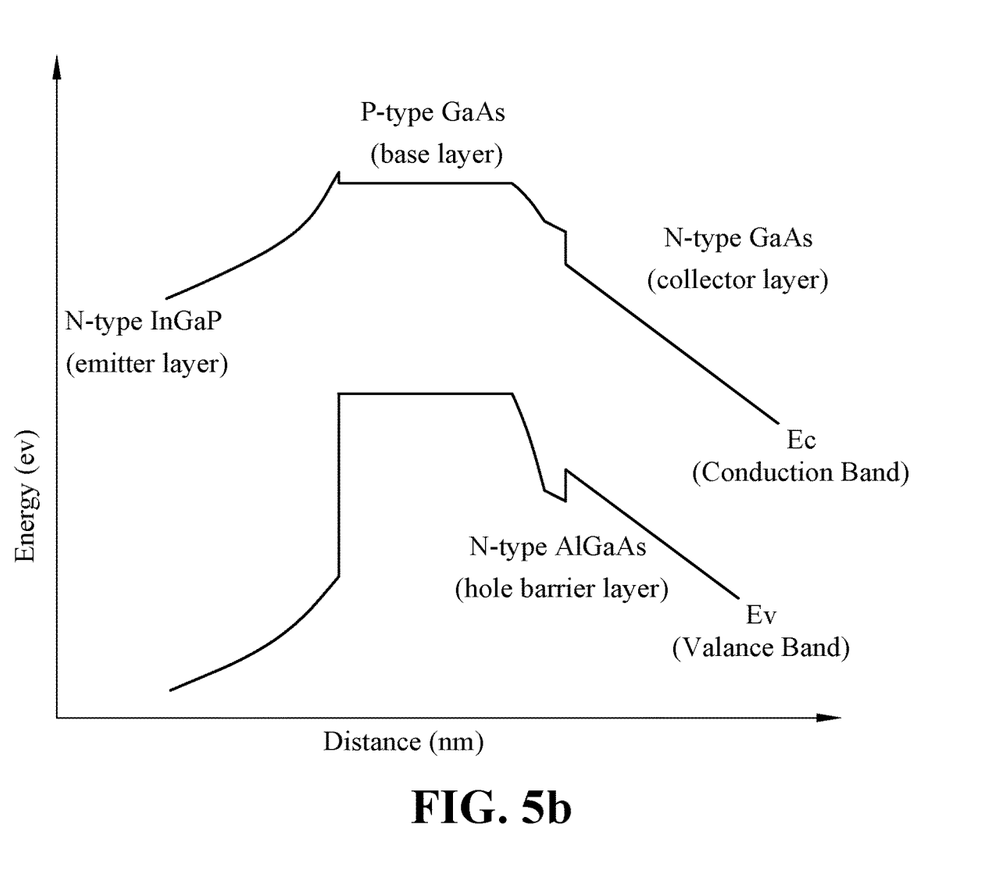
Figure 6A:
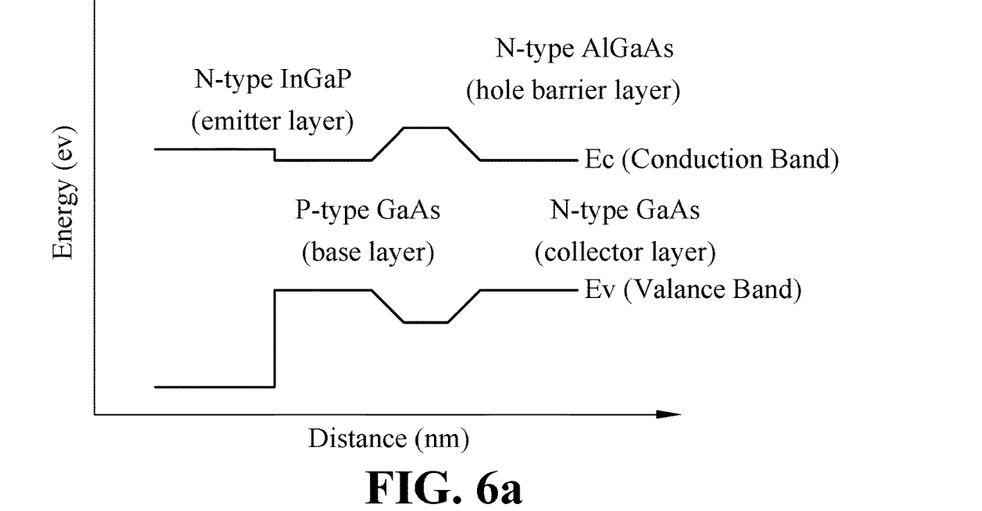
FIG. 6a and FIG. 6b show schematic views of the energy band diagram of the bandgap graded hole barrier layer of heterojunction bipolar transistor structure in accordance with yet another exemplary embodiment of the present invention.
Figure 6B:
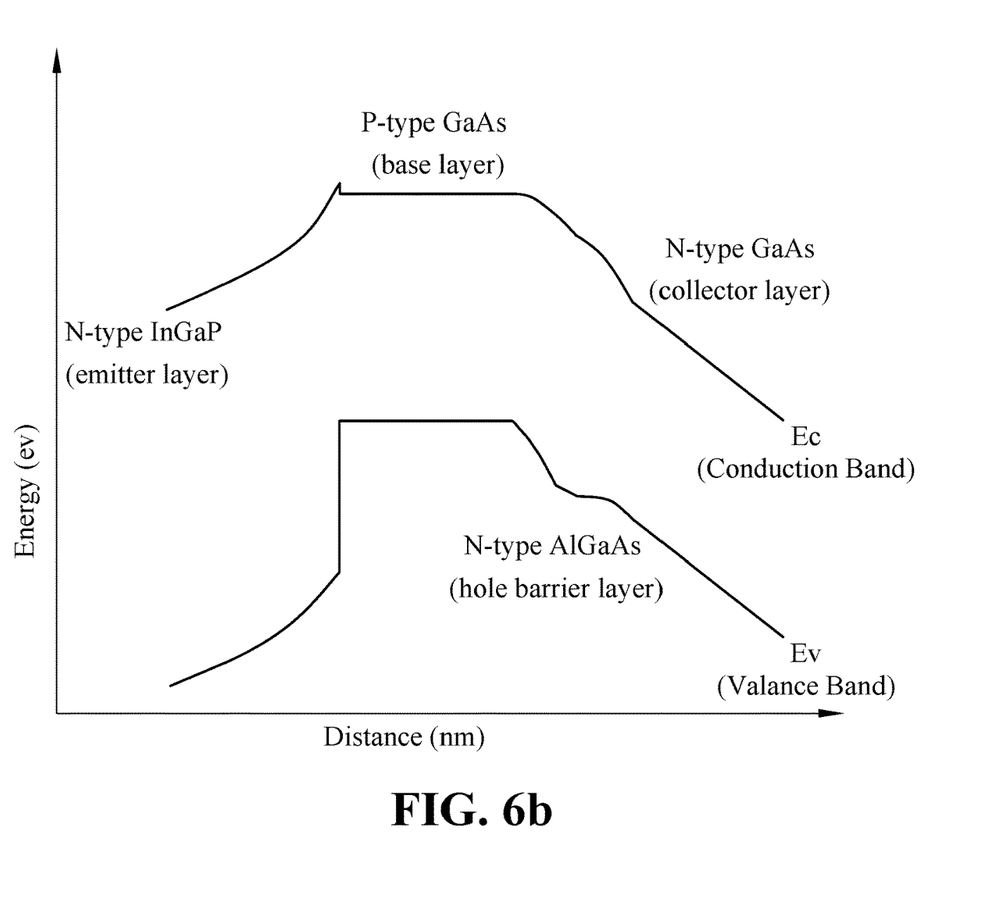

FIG. 3a and FIG. 3b show schematic views of the energy band diagram of the bandgap graded hole barrier layer of heterojunction bipolar transistor structure in accordance with an exemplary embodiment of the present invention. The bandgap increasing process of the hole barrier layer 35 from the base layer 40 towards the collector layer 30 forms at least one or more segments of linear graded bandgap, nonlinear graded bandgap, step graded bandgap, or a combination thereof, wherein, the bandgap of the hole barrier layer 35 may start from the bandgap of base layer 40 in the bandgap increasing process, but is not limited thereto. Furthermore, FIG. 4a and FIG. 4b show schematic views of the energy band diagram of the bandgap graded hole barrier layer of heterojunction bipolar transistor structure in accordance with another exemplary embodiment of the present invention, wherein the graded bandgap of the hold barrier layer 35 further comprises a bandgap decreasing process after the bandgap increasing process from the base layer 40 towards the collector layer 30. The bandgap of the hole barrier layer 35 forms at least one or more segments of linear graded bandgap, nonlinear graded bandgap, step graded bandgap, or a combination thereof, wherein the bandgap of the hole barrier layer 35 may start from the bandgap of base layer 40 in the increasing bandgap process, but is not limited thereto. Furthermore, FIG. 5a and FIG. 5b show schematic views of the energy band diagram of the bandgap graded hole barrier layer of heterojunction bipolar transistor structure in accordance with yet another exemplary embodiment of the present invention, wherein the graded bandgap of the hole barrier layer 35 further comprises at least a layer with a constant bandgap during and/or after the bandgap increasing process from the base layer 40 towards the collector layer 30. The bandgap of the hole barrier layer 35 forms at least one or more segments of linear graded bandgap, nonlinear graded bandgap, step graded bandgap, or a combination thereof, wherein, the bandgap of the hole barrier layer 35 may start from the bandgap of base layer 40 in the bandgap increasing process, but is not limited thereto. In addition, refer to FIG. 6a and FIG. 6b. FIG. 6a and FIG. 6b show schematic views of the energy band diagram of the bandgap graded hole barrier layer of heterojunction bipolar transistor structure in accordance with yet another exemplary embodiment of the present invention, wherein the graded bandgap of the hold barrier layer 35 further comprises at least a layer with a constant bandgap during and/or after the bandgap increasing process from the base layer 40 towards the collector layer 30 and also comprises a bandgap decreasing process after the bandgap increasing process of the hole barrier layer 35 from the base layer 40 towards the collector layer 30 and further comprises at least a layer with constant bandgap during and/or after the bandgap decreasing process. The bandgap of the hole barrier layer 35 forms at least one or more segments of linear graded bandgap, nonlinear graded bandgap, step graded bandgap, or a combination thereof, wherein, the bandgap of the hole barrier layer 35 may start from the bandgap of the base layer 40 in the bandgap increasing process, but is not limited thereto. Or, in another embodiment of the present invention (not shown), the graded bandgap of the hole barrier layer 35 further comprises a bandgap decreasing process after the bandgap increasing process from the base layer 40 towards the collector layer 30 and comprises at least a layer with a constant bandgap during and/or after the bandgap decreasing process; the bandgap of the hole barrier layer 35 forms at least one or more segments of linear graded bandgap, nonlinear graded bandgap, step graded bandgap, or a combination thereof. Wherein the bandgap of the hole barrier layer 35 may start from the bandgap of the base layer 40 in the bandgap increasing process, but is not limited thereto.

Therefore, the present invention provides the advantages of better device performance and ease of fabrication. In particular, the device performance will be better when operating at high voltages or high currents, and the saturation power will not be suppressed at high power operation. In addition, the present invention allows the electron barrier to be eliminated and maintains a sufficient hole barrier height.

Figure 7:
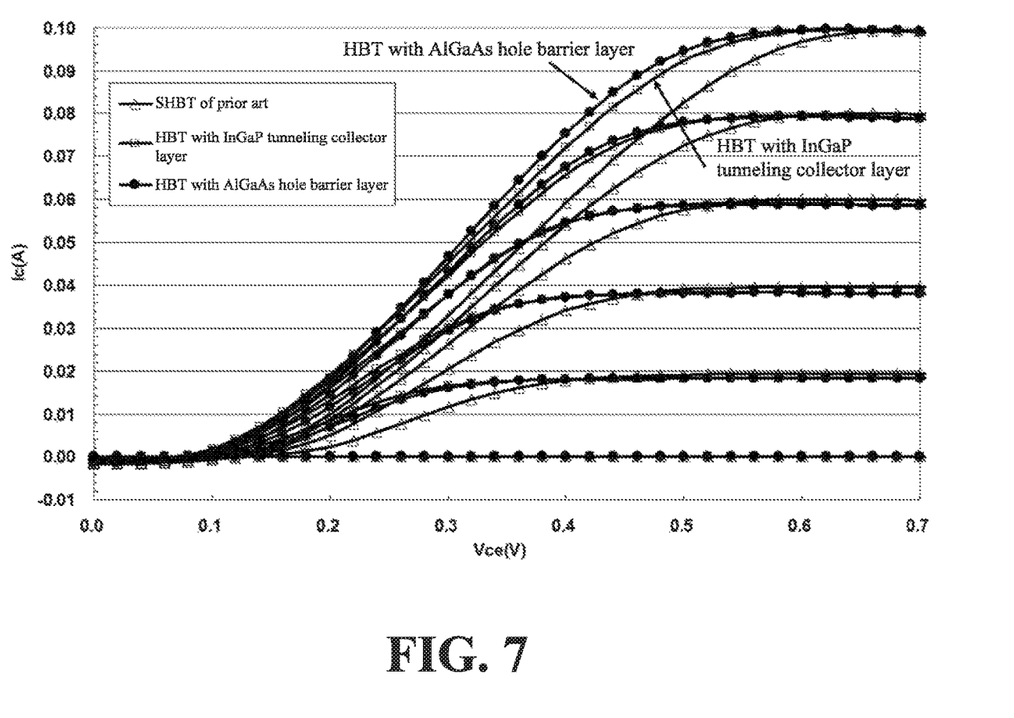
FIG. 7 shows a schematic view of the common emitter I-V characteristics of a conventional heterojunction bipolar transistor and of the exemplary embodiment of the present invention.

FIG. 7 shows a schematic view of the HBT common emitter I-V characteristics of the present invention. Compared with the conventional HBT, the present invention not only reduces the offset voltage, but also reduces the knee voltage, wherein the offset voltage refers to the collector-emitter voltage $V_{CE}$ when the collector current Ic is zero, and the knee voltage refers to the voltage at the boundary between the saturation region and the linear region. Meanwhile, the maximum saturation power Psat in high power operation is higher than the conventional HBT by 1.5 dBm. Therefore, the present invention can solve the problems in the prior art, improving the device DC and RF performance, and further improve the overall device performance of the PA.

In summary, according to the above embodiments of the present invention, the bandgap graded hole barrier layer formed of AlGaAs, AlGaAsN, AlGaAsP, AlGaAsSb, or InAlGaAs mainly composed of arsenic-containing materials, and will not form arsenic-phosphorus intermixing compound at the junction of the hole barrier layer and the mainly arsenic-containing base layer or collector layer. In addition to ease of the etching process and the improvement of the process yield, it is also easy to fabricate the graded bandgap at the junctions with the base layer or the collector layer to help reducing or eliminating the conduction band electron barrier at the junction of the hole barrier layer and the base layer or collector layer, as well as helping to maintain sufficient hole barrier height at the junction of the hole barrier layer and the base layer, and to effectively reduce the depth of the valence band quantum well at the junction of the hole barrier layer and the collector layer or even eliminate the valence band quantum well. In addition, the valence band discontinuity between the group of hole barrier layer materials and the base layer or the collector layer is smaller than the valence band discontinuity between InGaP or InGaAsP and the base layer or the collector layer and can be adjusted by varying the Aluminum composition. Reducing the valence band discontinuities can also reduce blocking too much holes at the junction of the base layer and the hole barrier layer at high current density, or avoid forming excessively deep hole quantum well at the junction of the hole barrier layer and the collector layer, which causes the excessive accumulation of holes in the quantum well to affect the efficiency and frequency response of the power amplifier in high current density operation. Furthermore, the sufficient hole barrier height at the junction of the hole barrier layer and the base layer can also protect the HBT device at extremely high current density operation to avoid damage caused by extremely high power density operation, so as to improve the ruggedness of the HBT device.

In short, according to the above embodiments of the present invention, to form a sufficient hole barrier height at the junction between the bandgap graded hole barrier layer and the base layer can protect the HBT in the high current density or high power density operation to improve the ruggedness of the HBT. Because of under extremely high current density or high power density condition, the hole barrier at the junction of the hole barrier layer and the base layer can block sufficient number of holes to change the electric field at the junction to form collector current blocking effect and prevent the HBT from damaging caused by extremely high power density.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitution and modifications are intended to be embraced within the scope of the invention as defined in the appended claims.

What is claimed is:

1. A heterojunction bipolar transistor (HBT) structure with a bandgap graded hole barrier layer, comprising:
   a sub-collector layer, formed of an N-type group III-V semiconductor and stacked on a substrate;
   a collector layer, stacked on the sub-collector layer and formed of a group III-V semiconductor;
   a hole barrier layer, stacked on the collector layer and formed of at least one of AlGaAs, AlGaAsN, AlGaAsP, AlGaAsSb, and InAlGaAs, wherein aluminum composition is less than 22%, and In, N, P, and Sb compositions are respectively less than or equal to 10%;
   a base layer, stacked on the hole barrier layer and formed of a P-type group III-V semiconductor;
   an emitter layer, stacked on the base layer and formed of an N-type group III-V semiconductor having bandgap larger than that of the base layer;
   an emitter cap layer, stacked on the emitter layer and formed of an N-type group III-V semiconductor; and
   an ohmic contact layer, stacked on the emitter cap layer and formed of an N-type group III-V semiconductor;
   wherein bandgaps of the hole barrier layer at least comprise a gradually increasing bandgap from the base layer towards the collector layer and a largest bandgap of the hole barrier layer is greater than bandgaps of the base layer and the collector layer respectively.

2. The heterojunction bipolar transistor structure with a bandgap graded hole barrier layer as claimed in claim 1, wherein the collector layer is formed of at least one of N-type GaAs and AlGaAs; the base layer is formed of at least one of P-type GaAs, GaAsSb, InGaAs, and InGaAsN; the emitter layer is formed of at least one of N-type AlGaAs, InGaP, and InGaAsP, and thickness of the hole barrier layer is 1 nm-300 nm; the emitter cap layer is formed of at least one of N-type GaAs, AlGaAs, InGaP, and InGaAsP; and the ohmic contact layer is formed of at least one of N-type GaAs and InGaAs.

3. The heterojunction bipolar transistor structure with a bandgap graded hole barrier layer as claimed in claim 1, further comprising: an intermediate composite layer, formed of a semiconductor material and provided between the substrate and the sub-collector layer.

4. The heterojunction bipolar transistor structure with a bandgap graded hole barrier layer as claimed in claim 3, wherein the intermediate composite layer comprises at least a buffer layer and the buffer layer is formed of a group III-V semiconductor.

5. The heterojunction bipolar transistor structure with a bandgap graded hole barrier layer as claimed in claim 3, wherein the intermediate composite layer comprises a field effect transistor (FET).

6. The heterojunction bipolar transistor structure with a bandgap graded hole barrier layer as claimed in claim 3, wherein the intermediate composite layer comprises a pseudomorphic high electron mobility transistor (pHEMT), and the pHEMT comprises at least a buffer layer, a first donor layer, a first spacer layer, a channel layer, a second spacer layer, a second donor layer, a Schottky layer, an etch stop layer, and a cap layer for ohmic contact, all stacked sequentially on the substrate from bottom up, the buffer layer is formed of a group III-V semiconductor; the first donor layer and the second donor layer are formed of at least one of N-type GaAs, N-type AlGaAs, N-type InAlGaP, N-type InGaP and N-type InGaAsP; the first spacer layer and the second spacer layer are formed of at least one of GaAs, AlGaAs, InAlGaP, InGaP, and InGaAsP; the channel layer is formed of at least one of GaAs, InGaAs, AlGaAs, InAlGaP, InGaP, and InGaAsP; the Schottky layer is formed of at least one of GaAs, AlGaAs, InAlGaP, InGaP, and InGaAsP; the etch stop layer is formed of at least one of GaAs, AlGaAs, InAlGaP, InGaAsP, InGaP, and AlAs; and the cap layer is formed of an N-type group III-V semiconductor.

7. The heterojunction bipolar transistor structure with a bandgap graded hole barrier layer as claimed in claim 1, wherein the bandgap of the hole barrier layer in the gradually increasing bandgap from the base layer towards the collector layer forms at least one or more segments of linear graded bandgap, nonlinear graded bandgap, step graded bandgap, or a combination thereof.

8. The heterojunction bipolar transistor structure with a bandgap graded hole barrier layer as claimed in claim 1, wherein the bandgaps of the hold barrier layer further comprise a decreasing bandgap after the gradually increasing bandgap from the base layer towards the collector layer, and the bandgaps of the hole barrier layer form at least one or more segments of linear graded bandgap, nonlinear graded bandgap, step graded bandgap, or a combination thereof.

9. The heterojunction bipolar transistor structure with a bandgap graded hole barrier layer as claimed in claim 1, wherein the bandgaps of the hole barrier layer further comprise at least a layer with a constant bandgap during and/or after the gradually increasing bandgap from the base layer towards the collector layer, and the bandgaps of the hole barrier layer form at least one or more segments of linear graded bandgap, nonlinear graded bandgap, step graded bandgap, or a combination thereof.

10. The heterojunction bipolar transistor structure with a bandgap graded hole barrier layer as claimed in claim 1, wherein the bandgaps of the hole barrier layer further comprise at least a layer with a constant bandgap during and/or after the gradually increasing bandgap from the base layer towards the collector layer, and also comprise a decreasing bandgap after the gradually increasing bandgap of the hole barrier layer from the base layer towards the collector layer and further comprise at least a layer with a constant bandgap during and/or after the decreasing bandgap; and the bandgaps of the hole barrier layer form at least one or more segments of linear graded bandgap, nonlinear graded bandgap, step graded bandgap, or a combination thereof.

11. The heterojunction bipolar transistor structure with a bandgap graded hole barrier layer as claimed in claim 1, wherein the bandgaps of the hole barrier layer further comprise a decreasing bandgap after the gradually increasing bandgap from the base layer towards the collector layer and comprise at least a layer with a constant bandgap during and/or after the decreasing bandgap; and the bandgaps of the hole barrier layer form at least one or more segments of linear graded bandgap, nonlinear graded bandgap, step graded bandgap, or a combination thereof.

12. The heterojunction bipolar transistor structure with a bandgap graded hole barrier layer as claimed in claim 1, further comprising: a spacer layer, formed of a group III-V semiconductor provided between the hole barrier layer and the base layer, and/or between the hole barrier layer and the collector layer.

13. The heterojunction bipolar transistor structure with a bandgap graded hole barrier layer as claimed in claim 12, wherein the spacer layer is formed of at least one of GaAs, GaAsSb, InGaAs, InGaAsN, AlGaAs, AlGaAsSb, AlGaAsP, InAlGaAs, and AlGaAsN.

14. The heterojunction bipolar transistor structure with a bandgap graded hole barrier layer as claimed in claim 12, wherein the spacer layer is P-type, undoped, or N-type.

* * * * *